Feb. 9, 1965 H. T. CLOSSON 3,169,226

BROADBAND CAVITY PARAMETRIC AMPLIFIER WITH TUNING

Filed June 25, 1962 2 Sheets-Sheet 1

INVENTOR.
HENRY T. CLOSSON

BY [signature]

ATTORNEY

BROADBAND CAVITY PARAMETRIC AMPLIFIER WITH TUNING

Filed June 25, 1962 2 Sheets-Sheet 2

INVENTOR.
HENRY T. CLOSSON
BY Harry E. Aine
ATTORNEY

United States Patent Office 3,169,226
Patented Feb. 9, 1965

3,169,226
BROADBAND CAVITY PARAMETRIC AMPLIFIER WITH TUNING

Henry T. Closson, Berkeley Heights, N.J., assignor to S-F-D Laboratories, Inc., Union, N.J., a corporation of New Jersey Filed June 25, 1962, Ser. No. 204,960
7 Claims. (Cl. 330—4.9)

Figures 1, 2:
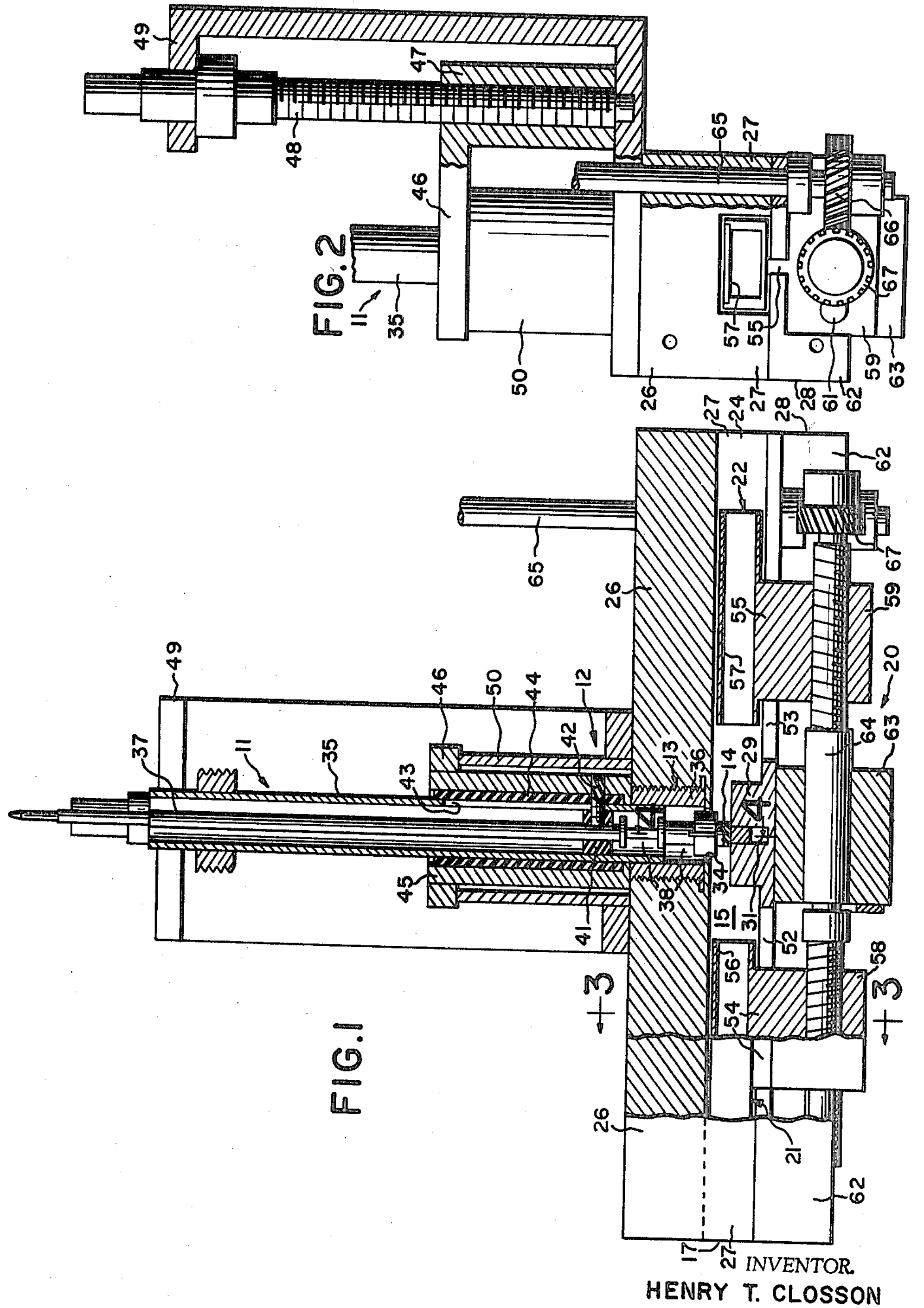

The present invention relates in general to parametric amplifiers, and, in particular, to a non-degenerative, reflective, self-biasing type parametric amplifier having a low noise level.

The term "parametric amplifier" is given to a class of devices used for amplifying and frequency converting by means of an element having non-linear reactance characteristics. Solid state elements having such non-linear reactance characteristics are known in the art as varactors. The outstanding feature of parametric amplifier is a low noise level. Low noise performance is possible because the amplification is obtained through a reactance which in itself is noiseless. Also, noise contribution via resistance components of the device are minimized because operating temperatures are at the ambient temperature level rather than at elevated temperatures such as exist in electron tubes utilizing thermionic emitters.

Certain disadvantages have been inherent in prior art parametric amplifiers. For example, in prior broadband parametric amplifiers undesirable microphonics and noise are introduced into the low noise device by the tuning means. Also, in previous parametric amplifiers there has not been complete isolation between the tuning means for the signal frequency, pump frequency, and idler frequency circuits resulting in the fact that frequency tuning of one of the circuits results in a certain degree of tuning of other circuits. Furthermore, since the gain of a parametric amplifier is a function of the pump power level incident on the varactor, the gain of prior parametric amplifiers was controlled by controlling the power level. However, varying the pump power level into the parametric amplifier also changes the operating point of the varactor thereby detuning the amplifier.

According to the present invention, a parametric amplifier is provided wherein the effect of tuning the separate circuits is completely isolated in the circuit being tuned, and a separate gain tuner is provided to vary the gain of the amplifier without detuning the amplifier. Also, a non-contacting idler frequency circuit tuner is provided to avoid tuning noise inherent in contacting tuners. Also, a parametric amplifier according to the present invention is provided with a lumped capacitance at the varactor diode for tuning the varactor circuits to give broad bandwidth for the idler circuit.

The principal object of the present invention is to provide an improved low noise, high frequency parametric amplifier having isolated gain and frequency tuning means.

One feature of the present invention is the provision of a novel parametric amplifier provided with a low pass filter in the signal input circuit and movable high pass filters for separation of the pump and idler circuits whereby complete isolation is obtained between the frequency tuning for the signal frequency, the pump frequency, and the idler frequency circuits.

Another feature of the present invention is the provision of a novel gain tuning mechanism for the parametric amplifier including a movable dielectric bead in the coaxial signal intput line to act as a variable impedance transformer between the input generator conductance and the negative conductance of the pump varactor whereby the gain of the parametric amplifier can be adjusted without detuning the amplifier.

Another feature of the present invention is the provision of novel idler frequency circuit tuning means including two non-contacting waveguide sections positioned in the waveguide cavity resonator of the parametric amplifier whereby the waveguide sections serve as high pass filters and are spaced from the waveguide of the cavity resonator apparatus to avoid tuning noise occasioned by contact between the tuner and cavity resonator.

Still another feature of the present invention is the provision of a novel parametric amplifier provided with a lumped capacitance at the varactor diode to the pump and idler frequency circuits to give a broad bandwidth to the idler frequency circuit.

Figure 3:
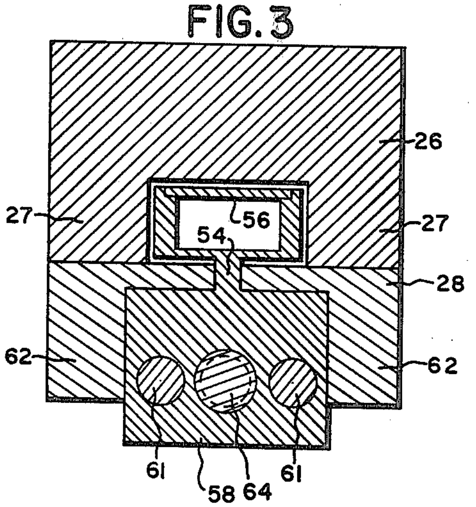
Figure 5:
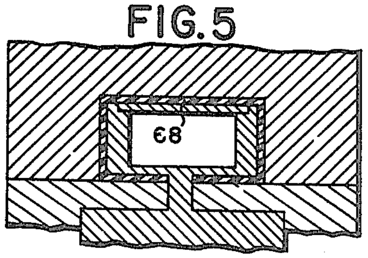
Figure 4:
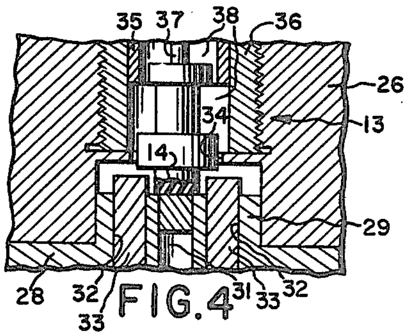
Figure 6:
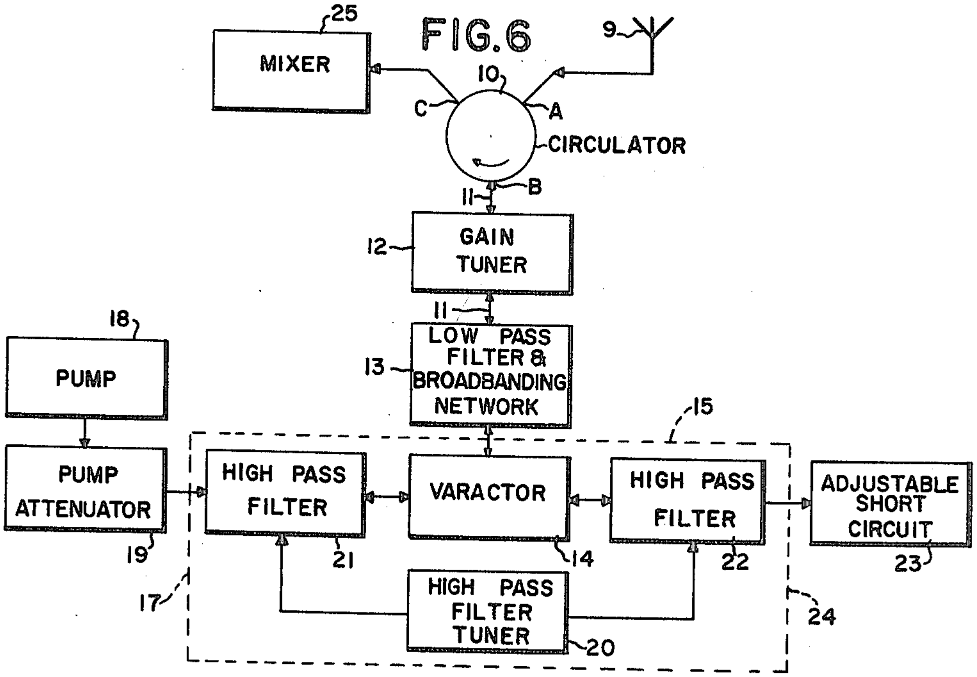

These and other features and advantages of the present invention will become more apparent upon a perusal of the following specification taken in connection with the accompanying drawings, wherein:

FIG. 1 is a side cross-sectional view, partially in elevation, of a parametric amplifier embodying the present invention, FIG. 2 is a righthand end view, partially broken away, of the structure shown in FIG. 1, FIG. 3 is a cross-sectional view of a portion of the structure of FIG. 1 taken along line 3—3 in the direction of the arrows, FIG. 4 is a cross-sectional view of a portion of a structure shown in FIG. 1 taken along line 4—4 in the direction of the arrows, FIG. 5 is a cross-sectional view of an alternative structure for that shown in FIG. 3, and FIG. 6 is a block diagram of a non-degenerate, reflective type, self-biasing parametric amplifier circuit embodied in the present invention as used in a radar receiver.

While the invention is especially adapted for a non-degenerate parametric amplifier, as described below, all the above features of the invention can be utilized to advantage in other types of parametric amplifiers as, for example, in up-converters.

Referring now to FIG. 6 which illustrates an apparatus according to the present invention as used in a radar receiver, received low frequency radar signal energy from an antenna 9 is directed to a circulator 10 of three-port variety. The three-ports include an input port A, an amplifier port B, and an output port C.

The low signal frequency energy (frequency$=f_s$) is coupled from the circulator 10 via the amplifier port B and a coaxial line 11 through a gain tuner 12 and a low pass filter and broadband network 13 to a varactor 14 housed in a waveguide cavity resonator 15. The varactor 14 is positioned substantially parallel to the electric field of the dominant mode of the cavity resonator 15.

High pump frequency energy (frequency $=f_p$) is supplied to one end 17 of the cavity resonator 15 from a pump source 18 such as, for example, a klystron. Since the gain of a parametric amplifier is a function of the pump power level, a variable attenuator 19 is provided between the pump 18 and the end 17 of the cavity resonator 15 to adjust the power level of the pump frequency energy incident upon the varactor 14 in the cavity resonator 15.

In the cavity resonator 15 low signal frequency ($f_s$) energy and high pump frequency ($f_p$) energy mix to produce difference or idler frequency ($f_i$) energy $$(f_i=f_p-f_s)$$

and the signal frequency energy is amplified by parametric amplification.

In the cavity resonator 15 on opposite sides of the varactor 14 are positioned high pass filters 21 and 22 which have a cut-off frequency above the idler frequency ($f_i$) but below the pump frequency ($f_p$) and which, therefore, define an idler frequency cavity therebetween. A high pass filter tuner 20 is provided to vary the frequency ($f_i$) of the idler cavity and thus the signal frequency of the amplifier because of the relationship $f_i = f_p - f_s$.

The low pass filter and broadband network 13 has a cut-off frequency above the signal frequency $f_s$ but below the pump and idler frequencies $f_p$ and $f_i$, respectively, to prevent pump and idler frequency energy from passing through the coaxial line 11.

The varactor 14 is positioned in a portion of the varactor cavity resonator 15 adapted to resonate simultaneously at the frequencies $f_s$, $f_p$ and $f_i$ without mutual interference.

An adjustable short circuit 23 is positioned at an end 24 of the waveguide cavity resonator 15 furthest from the pump 18 for a vernier adjustment of the resonant frequency of a pump cavity resonator or matched line therebetween.

The amplified signal frequency energy is reflected back through the low pass filter and broadband network 13 to the circulator amplifier port B via the coaxial line 11. The amplified signal is then passed through circulator 10 and out the output port C into, for example, a mixer 25 for mixing with a local oscillator signal contained in the radar receiver.

In FIGS. 1–4 showing a parametric amplifier embodying the present invention, the waveguide resonant cavity 15 is made up of an upper block portion 26 of, for example, brass, provided with downwardly projecting side portions 27 defining a channel therethrough and a lower cover portion 28 of, for example, brass closing the channel in the upper block portion 26 thereby defining a waveguide.

The lower cover portion 28 is provided with an upwardly projecting varactor mounting portion 29 which projects into the cavity resonator 15 and is provided with a bore 31 therein adapted to receive the first terminal of the varactor 14.

The varactor mounting portion 29 is also provided with additional bores 32 in the same transverse plane as the bore 31 receiving the varactor terminal, and these additional bores 32 are provided with capacitive rods 33 which extend into the cavity resonator 15 on either side of the varactor 14 to provide a lumped capacitance at the varactor plane of the cavity resonator 15. This lumped capacitance forms a part of the capacitance susceptance required to resonate the varactor and provides greater bandwidth in the idler circuit (described in detail below) than if the high pass filters 21 and 22 alone were used as the resonant idler circuit because with capacitive loading the idler resonant cavity is made physically shorter and therefore broader band.

The lumped capacitance can be provided by other means; for example, the rods 33 need not necessarily be in the same transverse plane as the varactor. Also either an annular ring can be provided on the varactor mounting portion 29 surrounding the varactor and projecting toward the upper block portion 26 or an annular ring can be provided on the upper block portion 26 projecting down toward said varactor mounting portion 29, and the lumped capacitance can be provided by iris means. While these other structures can be utilized for the lumped capacitance, the rods 33 in the bores 32 work successfully and are relatively simple to provide.

Signal frequency energy is fed into the cavity resonator 15 by coaxial line 11 through an aperture 34 in the upper block portion 26 opposite the varactor mounting portion 29. An outer conductor 35 of the coaxial line 11 is connected to the inside diameter of an outwardly threaded, hollow cylindrical sleeve 36 of, for example, brass, which is screwed into a threaded bore axially aligned with the aperture 34 in the upper block portion 26. The cavity end of the center conductor 37 of the coaxial line 11 is slotted and apertured for supporting the second terminal of the varactor 13 therein by a friction fit.

Adjacent the cavity end of the outer conductor 35 the diameter of the center conductor 37 is stepped to provide two inductive sections 38 for the low pass filter 13 adapted to pass signal frequency energy to and from the varactor but to prevent passage of the idler and pump frequencies down the coaxial line 11. The coaxial line impedance is designed as 50 ohms to match the 50 ohm impedance of the varactor thereby providing a broadband network.

A dielectric bead 41 of, for example, Teflon, is slideably positioned between the outer and center conductors 35 and 37 of the coaxial line 11 axially outwardly of the chokes 38. The dielectric bead 41 is movably controlled by means of a dielectric pin 42 of, for example, Teflon, which screws into the bead 41 and projects through a longitudinal slot 43 in the outer conductor 35 of the coaxial line 11. The pin 42 is secured in a dielectric sleeve 44 of, for example, Teflon, which surrounds the outer conductor 35, and the dielectric sleeve 44 is held within a metallic sleeve 45 as of, for example, brass. The pin 42 and the sleeve 44 of dielectric material permit actuation of the bead 41 without metal-to-metal contact and provide a good sliding surface.

The metallic sleeve 45 is moved axially of the coaxial line 11 by means of an actuating plate 46 which is provided with a drive portion 47 with an inwardly threaded bore adapted to receive a gain control tuning screw 48. The gain control tuning screw 48 is axially aligned with the coaxial line 11 and is captured against longitudinal movement by means of a bracket 49 mounted on the upper block portion 26.

A metallic sleeve 51 of, for example, brass surrounds the coaxial line 11 in the region of the longitudinal slot 43 to prevent radiation loss therefrom and is bolted to the upper block portion 26.

By varying the position of the dielectric bead 41 the gain of the amplifier is adjusted. For a restricted range of phase angles between the bead and the varactor terminal, the standing wave ratio introduced by the presence of the dielectric bead acts as a variable impedance transformer between the input generator conductance and the negative conductance of the pumped varactor. A change in impedance of this transformer effects a variation in amplifier gain.

This method and apparatus for gain adjustment is superior to the conventional manner of varying amplifier gain, i.e. varying the pump power level to the amplifier, since the latter method changes the operating point of the varactor and thereby detunes the amplifier.

The high pass filters 21 and 22 and the tuner mechanism 20 will now be described in greater detail. The lower cover portion 28 from the ends thereof to adjacent the varactor mounting portion 29 is provided with longitudinal slots 52 and 53 which are adapted to receive slideably therein support arms 54 and 55, respectively, for hollow rectangular waveguide sections 56 and 57, respectively, positioned within the waveguide 30. The support arms 54 and 55 extend upwardly from support blocks 58 and 59, respectively, of, for example, brass, each of which is slideably mounted on two guide pins 61 of, for example, stainless steel (see FIG. 3), and is contained against side movement by downwardly projecting sides 62 of the lower cover portion 28. The guide pins are secured in a support member 63 of, for example, steel, fixedly secured between the downwardly projecting sides 62 of the lower cover portion 28 in the region of the varactor mounting portion 29.

A threaded tuner drive shaft 64 is captured in its midportion in the support member 63 against longitudinal movement and is provided with oppositely directed threads on the two ends thereof which mate with threads in bores through the support blocks 58 and 59. The tuner drive shaft 64 is driven by a tuner actuating rod 65 which is provided with a helical gear 66 mating with a helical gear 67 on one end of the tuner drive shaft 64. Rotation of the tuner actuating rod 65 causes rotation of the tuner drive shaft to cause both support blocks 58 and 59 and thus the waveguide sections 56 and 57 to move either closer together or further apart.

The outside dimensions of the waveguide sections 56 and 57 are smaller than the inside dimensions of the waveguide 15. By accurate support of the support blocks 58 and 59 on the guide pin 61 and between the downwardly projecting sides 62 of the lower cover portion 28 metal-to-metal contact is prevented between waveguide sections 56 and 57 and the waveguide 15. Also, the outside surface of the support arms 54 and 55 are coated with an insulating material, such as, for example, epoxy paint to prevent metal-to-metal contact with the lower cover portion 28.

Alternatively, the waveguide sections 56 and 57 can be insulated from the waveguide 15 by providing an insulating material 68 such as, for example, Teflon or Mylar, on the exterior surface of the waveguide sections 56 and 57 as shown in FIG. 5.

The inside dimensions of the waveguide sections 56 and 57 are selected as waveguides beyond cut-off for the idler frequency $f_i$ but not for the pump frequency $f_p$, so that the waveguide sections 56 and 57 serve as high pass filters which pass the pump frequency $f_p$ but do not pass the idler frequency $f_i$. Therefore, the resonant idler frequency circuit containing the varactor 14 is defined in the waveguide 15 between the waveguide sections 56 and 57. This idler frequency circuit and therefore the signal frequency of the parametric amplifier can be individually tuned by movement of the waveguide sections 56 and 57 as described above.

A resonant pump frequency circuit containing the varactor 14 is defined by the matched line from the pump 18 including the waveguide 15 from one end 17 thereof to the adjustable short circuit 23 at the other end thereof. This pump frequency circuit can be individually tuned by movement of the adjustable short circuit 23.

A signal frequency resonance circuit containing the varactor 14 is defined by the coaxial line 11 and the section of the waveguide 15 immediately adjacent to the varactor mounting portion 29. The dimensions of the waveguide 15 are selected so as to be a waveguide beyond cut-off for the signal frequency $f_s$ but not the idler and pump frequencies $f_i$ and $f_p$. Therefore, signal frequency energy will not propagate into the waveguide 15 other than in the region of the varactor 14.

Thus, the frequency tuning means for the idler frequency and pump frequency circuits are separate and neither of these circuits nor the signal frequency circuit is effected by the tuning means of the other circuit thereby providing an easily adjustable parametric amplifier.

A typical non-degenerate, reflective, self-biasing parametric amplifier of the type described above has a pump frequency of 17.8 gc. and operates over a frequency range of 5.4 to 5.9 gc. with a 17 db nominal gain and a 3.5 db maximum noise figure, including the noise figure of the associated circulator 10. The gain is adjustable from 15 db to 25 db by means of the movable dielectric bead 41 in the signal input coaxial line.

Since many changes can be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. An amplifier comprising: a first cavity resonator, a non-linear capacitance device having two end terminals and disposed in said cavity resonator substantially parallel to the electric field of the dominant mode of said cavity resonator, means for mounting said non-linear capacitance device within said cavity resonator, means connecting to one of said terminals of said capacitance device and protruding through an aperture in the wall of said cavity resonator to form a center conductor of a coaxial line, means for providing a low pass filter in said coaxial line, means for feeding low frequency energy into said first cavity resonator and non-linear capacitance device through said low pass filter, means for coupling high frequency pump energy into said cavity resonator and non-linear capacitance device, said first cavity resonator being resonant at a first high frequency to supply high frequency energy to said non-linear capacitance device, means providing a pair of spaced apart waveguide filters in said first cavity resonator straddling said non-linear capacitance device for defining therebetween a second cavity resonator which is tunable to a frequency lower than said first high frequency by movement of at least one of said waveguide filter means relative to the other whereby said first and second resonator frequencies can be tuned without mutual interference.

2. An amplifier according to claim 1 including a movable dielectric bead means disposed in said coaxial line for operating as a variable impedance transformer between an input generator conductance of an input device supplying the signal to be amplified and the negative conductance of the pumped non-linear capacitance device whereby changing the position of said bead means will change the gain of the amplifier.

3. An amplifier according to claim 1 wherein said non-linear capacitance is a varactor diode and wherein said means for providing a tunable second cavity includes two waveguide sections slideably positioned within said first cavity resonator on opposite sides of said varactor, said waveguide sections having a low frequency cutoff above said idler frequency but below said pump frequency and means for moving both said waveguide sections toward said varactor or away from said varactor for tuning said idler cavity.

4. An amplifier according to claim 3 including a movable dielectric bead means in said coaxial line operating as a variable impedance transformer between an input generator conductance of an input device supplying the signal to be amplified and the negative conductance of the pumped varactor whereby changing the position of said bead means will change the gain of the amplifier.

5. An amplifier according to claim 3 wherein said two slideable waveguide sections include a pair of hollow conductive members disposed in electrical insulative slideable relationship over a preponderance of their outer surface within and with respect to the inside conductive surface of said first cavity resonator whereby variable contact noises are minimized.

6. The amplifier according to claim 5 wherein said pair of slideable waveguide sections include dielectric insulator members disposed inbetween the outer conductive surfaces of said pair of slideable hollow conductive members and the inside conductive surface of said first cavity resonator.

7. The amplifier according to claim 2 wherein said dielectric bead means includes a hollow dielectric member disposed between the inner and outer conductors of said coaxial line and being axially movable within said coaxial line on the side of said low pass filter remote from said non-linear capacitance device.

References Cited in the file of this patent

UNITED STATES PATENTS 2,970,275 Kurzrok ............... Jan. 31, 1961

OTHER REFERENCES

"Microwave Theory and Techniques," by Reich et al., Van Nostrand, New York, 1953 (page 330).

Pettai et al.: "Proceedings of the IRE," July 1960, pages 1323–1324.